US009620640B2

(12) United States Patent
Hung et al.

(10) Patent No.: US 9,620,640 B2
(45) Date of Patent: Apr. 11, 2017

(54) BODY-CONTACT METAL-OXIDE-SEMICONDUCTOR FIELD EFFECT TRANSISTOR DEVICE

(71) Applicant: MediaTek Inc., Hsin-Chu (TW)

(72) Inventors: Cheng-Chou Hung, Hukou Township, Hsinchu County (TW); Tung-Hsing Lee, New Taipei (TW); Bernard Mark Tenbroek, Kent (GB); Rong-Tang Chen, Huwei Township, Yunlin County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/450,445

(22) Filed: Aug. 4, 2014

(65) Prior Publication Data

US 2015/0123206 A1    May 7, 2015

Related U.S. Application Data

(60) Provisional application No. 61/899,343, filed on Nov. 4, 2013.

(51) Int. Cl.
    *H01L 21/02*    (2006.01)
    *H01L 29/78*    (2006.01)
    (Continued)

(52) U.S. Cl.
    CPC ........ *H01L 29/783* (2013.01); *H01L 29/0649* (2013.01); *H01L 29/1095* (2013.01); *H01L 29/4238* (2013.01); *H01L 29/4975* (2013.01); *H01L 29/78615* (2013.01); *H01L 29/78654* (2013.01); *H01L 29/78657* (2013.01)

(58) Field of Classification Search
    CPC ........ H01L 2924/00; H01L 2924/0002; H01L 29/7813; H01L 29/66734; H01L 29/1095; H01L 29/783; H01L 29/4975; H01L 29/4238; H01L 29/0649; H01L 29/78654; H01L 29/78615; H01L 29/78657
    See application file for complete search history.

(56) References Cited

U.S. PATENT DOCUMENTS 6,281,593 B1 *   8/2001   Brown .............. H01L 29/78615
                                                          257/213
6,677,645 B2 *   1/2004   Bryant .............. H01L 29/78615
                                                          257/347

(Continued)

*Primary Examiner* — Allen Parker
*Assistant Examiner* — Wasiul Haider
(74) *Attorney, Agent, or Firm* — McClure, Qualey & Rodack, LLP (57) ABSTRACT

The invention provides a body-contact metal-oxide-semiconductor field effect transistor (MOSFET) device. The body-contact MOSFET device includes a substrate. An active region is disposed on the substrate. A gate strip is extended along a first direction disposed on a first portion of the active region. A source doped region and a drain doped region are disposed on a second portion and a third portion of the active region, adjacent to opposite sides of the gate strip. The opposite sides of the gate strip are extended along the first direction. A body-contact doped region is disposed on a fourth portion of the active region. The body-contact doped region is separated from the gate strip by a fifth portion of the active region. The fifth portion is not covered by any silicide features.

32 Claims, 4 Drawing Sheets

(51) Int. Cl.
*H01L 29/06* (2006.01)
*H01L 29/423* (2006.01)
*H01L 29/10* (2006.01)
*H01L 29/49* (2006.01)
*H01L 29/786* (2006.01)

(56) References Cited

U.S. PATENT DOCUMENTS

| | | | |
|---|---|---|---|
| 6,794,716 B2* | 9/2004 | Park et al. | 257/347 |
| 6,940,130 B2* | 9/2005 | Bryant et al. | 257/350 |
| 2011/0294444 A1* | 12/2011 | Kawano | 455/83 |
| 2012/0205744 A1* | 8/2012 | O | H01L 21/266 257/352 |

* cited by examiner

BODY-CONTACT METAL-OXIDE-SEMICONDUCTOR FIELD EFFECT TRANSISTOR DEVICE

CROSS REFERENCE TO RELATED APPLICATIONS

This application claims the benefit of U.S. Provisional Application No. 61/899,343, filed on Nov. 4, 2013, the entirety of which is incorporated by reference herein.

BACKGROUND OF THE INVENTION

Field of the Invention

The present invention relates to a body-contact metal-oxide-semiconductor field effect transistor (MOSFET) device, and in particular to a body-contact silicon-on-insulator (SOI) MOSFET device.

Description of the Related Art

Body-contact metal-oxide-semiconductor field effect transistors (MOSFETs) have been widely implemented in radio frequency (RF) applications. Low loss and high linearity are the critical demands for the body-contact MOSFETs applied in RF silicon-on-insulator (SOI) switch devices and tuner devices. However, parasitic capacitance in the conventional body-contact MOSFETs may cause the increased index of ON-state-resistance*OFF-state-capacitance (Ron* Coff). The increased index of ON-state-resistance*OFF-state-capacitance (Ron* Coff) may cause high RF loss and poor linearity.

Thus, a novel body-contact MOSFET device is desirable.

BRIEF SUMMARY OF INVENTION

A body-contact metal-oxide-semiconductor field effect transistor (MOSFET) device is provided. An exemplary embodiment of a body-contact MOSFET device includes a substrate. An active region is disposed on the substrate. A gate strip is extended along a first direction disposed on a first portion of the active region. A source doped region and a drain doped region are disposed on a second portion and a third portion of the active region, adjacent to opposite sides of the gate strip. The opposite sides of the gate strip are extended along the first direction. A body-contact doped region is disposed on a fourth portion of the active region. The body-contact doped region is separated from the gate strip by a fifth portion of the active region. The fifth portion is not covered by any silicide features.

Another exemplary embodiment of a body-contact metal-oxide-semiconductor field effect transistor (MOSFET) device includes a substrate. An active region is disposed on the substrate. The active region includes a metal-oxide-semiconductor field effect transistor (MOSFET) portion configured for a MOSFET formed thereon. A body-contact doped region portion is configured for a body-contact doped region formed thereon. The MOSFET portion is separated from the body-contact doped region portion. A connecting portion is disposed between and connected to both the MOSFET portion and the body-contact doped region portion. The connecting portion is not covered by any silicide features.

Yet another exemplary embodiment of a body-contact metal-oxide-semiconductor field effect transistor (MOSFET) device includes a substrate. An active region is disposed on the substrate. The active region includes a metal-oxide-semiconductor field effect transistor (MOSFET) portion configured for a MOSFET formed thereon. A body-contact doped region portion is configured for a body-contact doped region formed thereon. The MOSFET portion is connected to the body-contact doped region portion only through a connecting portion. The connecting portion is not covered by any silicide features.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Embodiments of a body-contact metal-oxide-semiconductor field effect transistor (MOSFET) device are provided. The body-contact MOSFET includes a body-contact silicon-on-insulator (SOI) MOSFET. The body-contact MOSFET has a reduced parasitic capacitance, thereby improving an index of ON-state-resistance*OFF-state-capacitance (Ron* Coff). A body-contact MOSFET having low RF loss and high linearity is obtained.

Figure 1A:
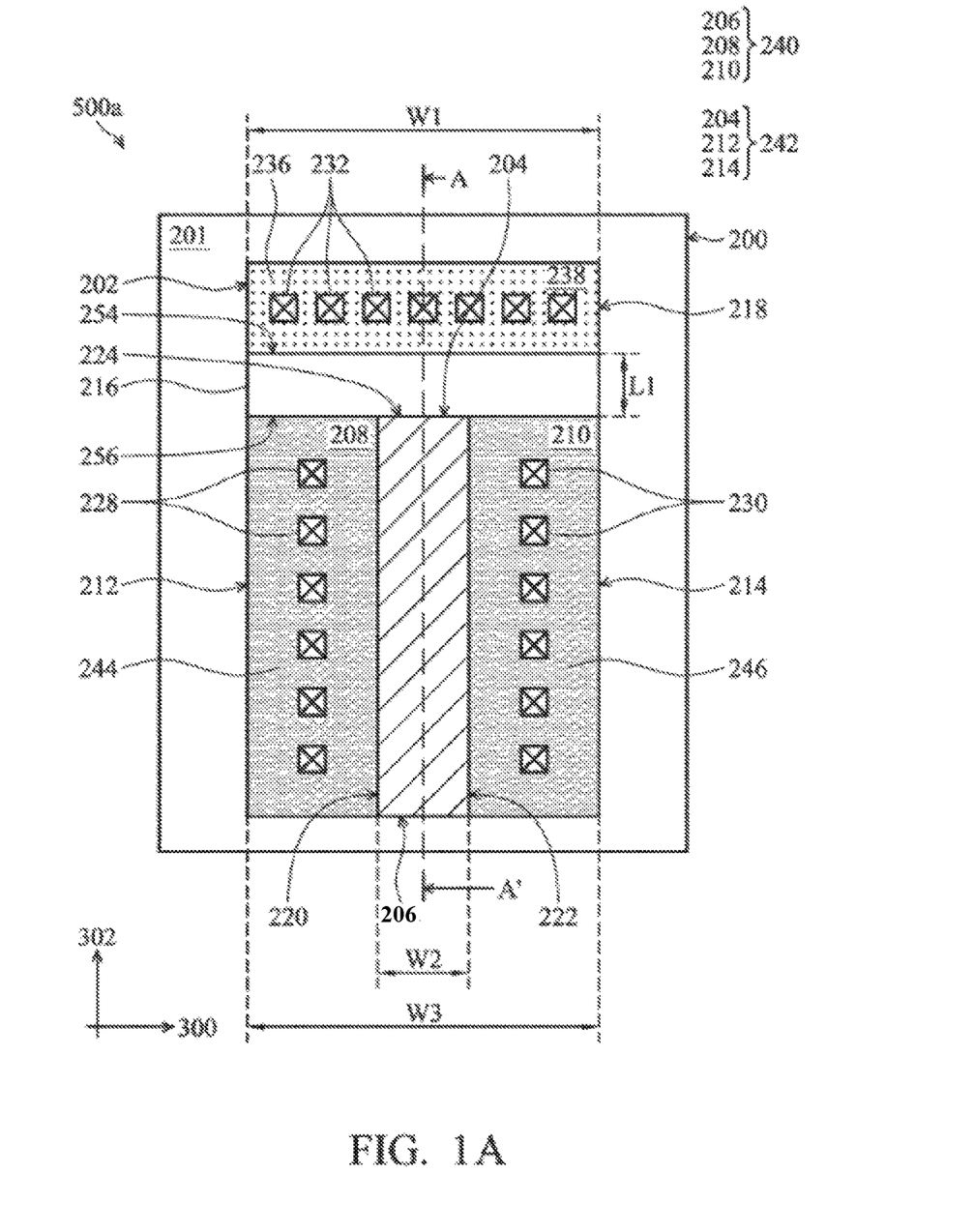
FIG. 1A shows a top view of one exemplary embodiment of a body-contact metal-oxide-semiconductor field effect transistor (MOSFET) device of the invention.
Figure 1B:
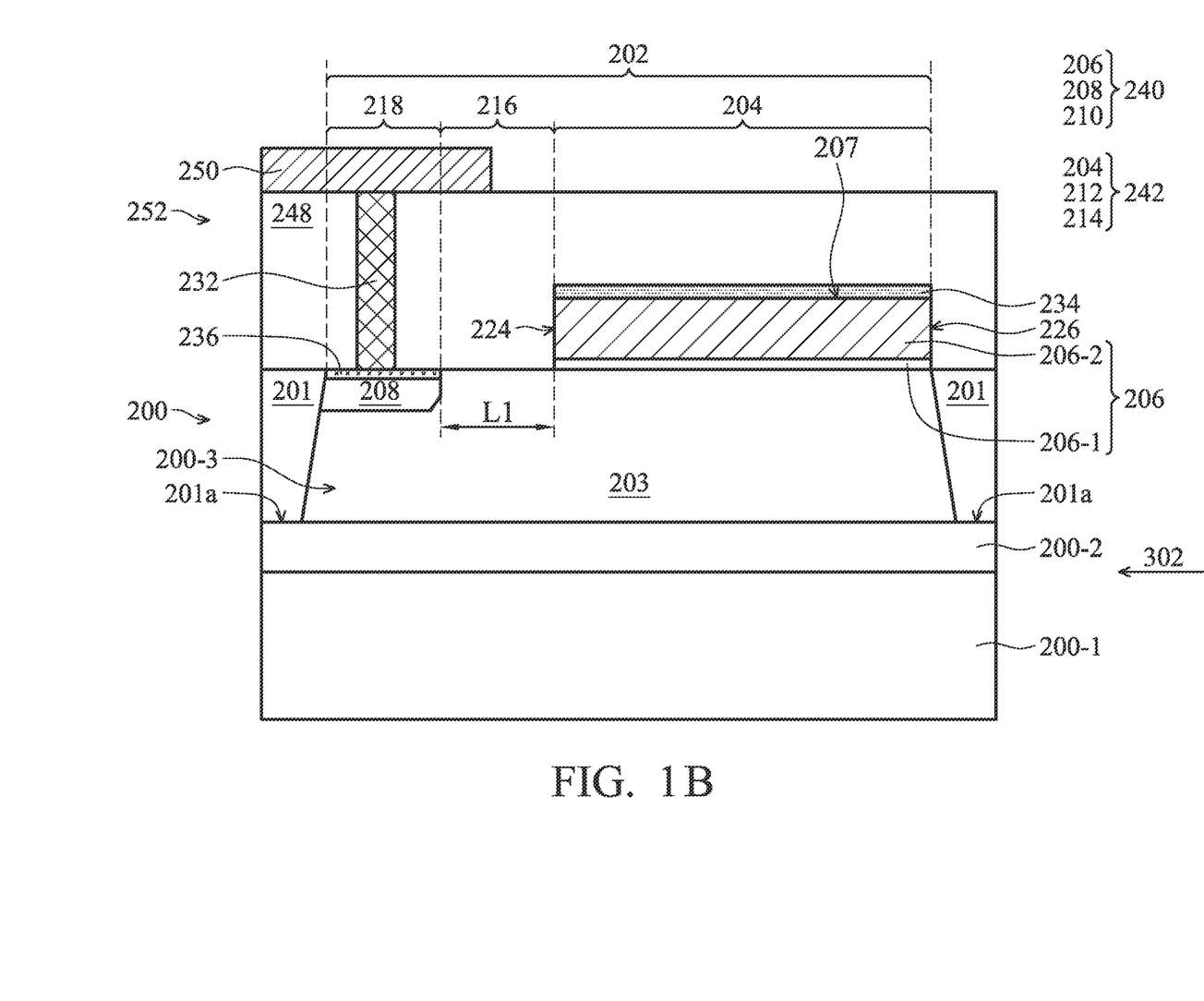
FIG. 1B shows a cross section taken along line A-A' of FIG. 1A.

FIG. 1A shows a top view of one exemplary embodiment of a body-contact metal-oxide-semiconductor field effect transistor (MOSFET) device 500a of the invention. FIG. 1B shows a cross section taken along line A-A' of FIG. 1A, showing one exemplary embodiment of a body-contact metal-oxide-semiconductor field effect transistor (MOSFET) device 500a of the invention. As shown in FIGS. 1A and 1B, the body-contact MOSFET device 500a includes a substrate 200, an active region 202 in the substrate 200 and a MOSFET 240 on the substrate 200 in accordance with some embodiments. In some embodiments, the substrate 200 includes a silicon-on-insulator (SOI) substrate or a silicon-on-sapphire (SOS) substrate. In some embodiments as shown in FIG. 1B, the substrate 200 is composed of a handling layer 200-1, an insulating layer 200-2 and a device layer 200-3. In some embodiments, the handling substrate 200-1 includes a semiconductor material layer or a sapphire layer. The insulating layer 200-2 is formed on the handling substrate 200-1. In some embodiments, the insulating layer 200-2 includes a buried-oxide layer. The device layer 200-3 is formed on the insulating layer 200-2. In some embodiments, the device layer 200-3 includes a semiconductor material layer, for example, a silicon layer.

In some embodiments, an isolation feature 201 is formed through the device layer 200-3 as shown in FIG. 1B. In some embodiments, a bottom 201a of the isolation feature 201 is in contact with the insulating layer 200-2. A region of the device layer 200-3 surrounded by the isolation feature 201 is defined as the active region 202. In some embodiments, the isolation feature 201 includes a shallow trench isolation (STI) feature.

In some embodiments, the active region 202 includes a metal-oxide-semiconductor field effect transistor (MOSFET) portion 242, a body-contact doped portion 218 and a connecting portion 216. The MOSFET portion 242 is configured for the MOSFET 240 formed thereon, the body-contact doped portion 218 is configured for a body-contact doped region 238 formed thereon, and the connecting portion 216 is configured to provide a connection between the MOSFET portion 242 and the body-contact doped portion 218. In some embodiments, a well-doped region 203 is formed within the active region 202. For example, the well-doped region 203 is a p-well-doped region.

As shown in FIG. 1A, the MOSFET 240 is formed on the metal-oxide-semiconductor field effect transistor (MOSFET) portion 242 of the active region 202 in accordance with some embodiments. In some embodiments, the MOSFET 240 includes a gate strip 206, a source doped region 208 and a drain doped region 210 as shown in FIG. 1A. As shown in FIGS. 1A and 1B, the gate strip 206 of the MOSFET 240 is disposed on a first portion 204 of the MOSFET portion 242 of the active region 202 in accordance with some embodiments. In some embodiments, the gate strip 206 is extended substantially along a direction 302. As shown in FIG. 1B, the gate strip 206 includes a gate insulating layer 206-1 and a gate electrode layer 206-2 formed on the gate insulating layer 206-1. Also, spacers (not shown) are formed on opposite sides 220 and 222 of the gate strip 206. In some embodiments, a silicide feature 234 is formed on a top surface 207 of the gate electrode layer 206-2 as shown in FIG. 1B.

As shown in FIG. 1A, the source doped region 208 and the drain doped region 210 of the MOSFET 240 are respectively formed on a second portion 212 and a third portion 214 of the active region of the MOSFET portion 242 of the active region 202 in accordance with some embodiments. In some embodiments, the source doped region 208 and the drain doped region 210 have a first conductive type, and the well-doped region 203 has a second conductive type opposite to the first conductive type. For example, the source doped region 208 and the drain doped region 210 are n-type, and the well-doped region 203 is p-type. In some embodiments, the source doped region 208 and the drain doped region 210 are formed adjacent to opposite sides 220 and 222 of the gate strip 206 as shown in FIG. 1A. The opposite sides 220 and 222 of the gate strip 206 are extended substantially along the direction 302. Therefore, a channel width W2 of the MOSFET 240 is defined by a width of the gate strip 206 between the source doped region 208 and the drain doped region 210. Also, a channel width direction of the MOSFET 240 is substantially parallel to the direction 300, and a channel length direction of the MOSFET 240 is substantially parallel to the direction 302.

In some embodiments, silicide features 244 and 246 are respectively formed on top surfaces of the source doped region 208 and the drain doped region 210 as shown in FIG. 1A. In some embodiments, contact plugs 228 and 230 of an interconnection structure (such as an interconnection structure 252 as shown in FIG. 1B) are respectively formed on the source doped region 208 and the drain doped region 210 as shown in FIG. 1A.

As shown in FIGS. 1A and 1B, the body-contact doped portion 218 is configured for a body-contact doped region 238 formed thereon. The body-contact doped portion 218 is provided as a pick-up dope region for the well-doped region 203. In some embodiments, both the body-contact doped region 238 and the well-doped region 203 have the same conductive type. For example, the body-contact doped region 238 and the well-doped region 203 are p-type. In some embodiments, a silicide feature 236 is formed on the body-contact doped region 238 as shown in FIGS. 1A and 1B.

As shown in FIG. 1B, the interconnection structure 252 is formed on the active region 202 in accordance with some embodiments. In some embodiments, the interconnection structure 252 includes a dielectric layer 248, contact plugs (such as contact plugs 232 as shown in FIGS. 1A and 1B and the contact plugs 228 and 230 as shown in FIG. 1A) formed through the dielectric layer 248, and a conductive line 250 on the dielectric layer 248. In some embodiments, the contact plugs 232 of the interconnection structure (such as the interconnection structure 252 as shown in FIG. 1B) are formed on the body-contact doped region 238 as shown in FIGS. 1A and 1B.

As shown in FIGS. 1A and 1B, the connecting portion 216 is designed disposed between and connected to both the MOSFET portion 204 and the body-contact doped portion 218 of the active region 202 in accordance with some embodiments. Therefore, the MOSFET portion 204 is indirectly connected to the body-contact doped portion 218 only through the connecting portion 216. In some embodiments, the connecting portion 216 of the active region 202 is designed with a width W1 substantially along the direction 300 and a length L1 substantially along the direction 302 as shown in FIGS. 1A and 1B. It is noted that the body-contact doped portion 218 is designed to be separated from the MOSFET portion 240 along the channel length direction, which is substantially parallel to the direction 302 as shown in FIGS. 1A and 1B in accordance with some embodiments.

As shown in FIGS. 1A and 1B, the body-contact doped portion 218 is separated from the gate strip 206, the source doped region 208 and the drain doped region 210 of the MOSFET 240 by the connecting portion 216 of the active region 202. That is to say, the body-contact doped portion 218 of the active region 202 is separated from the first portion 206, second portion 212 and third portion 214 of the active region 202 by a distance. In some embodiments, the distance is equal to the length L1 of the connecting portion 216 of the active region 202 substantially along the direction 302.

In some embodiments, the connecting portion 216 is configured to provide a connection between the MOSFET portion 242 and the body-contact doped portion 218 of the active region 202. In some embodiments, the connecting portion 216 of the active region 202 is designed not to be covered by any silicide features, to avoid a short-circuit occurring between the body-contact doped portion 218 and the MOSFET 240 as shown in FIGS. 1A and 1B. In some embodiments, the connecting portion 216 of the active region 202 is blocked by a resistance protective oxide (RPO)

layer before performing a silicidation process. The RPO layer is used to prevent any silicide features form forming on the connecting portion 216. In some embodiments, the RPO layer covering the connecting portion 216 is removed after performing the silicidation process. Also, the connecting portion 216 of the active region 202 is designed not to be covered by the gate strip 206 or other polysilicon patterns to avoid generating any parasitic capacitance. In some embodiments, the parasitic capacitance includes, for example, a gate-to-substrate capacitance (Cgb), a gate-to-source capacitance (Cgs) or a gate-to-drain capacitance (Cgd). Therefore, the body-contact doped portion 218 and the gate strip 206 are adjacent to opposite sides 254 and 256 of the connecting portion 216 of the active region 202, respectively. As shown in FIG. 1A, the opposite sides 254 and 256 of the connecting portion 216 of the active region 202 are substantially extended along the direction 300.

In some embodiments, the width W1 of the connecting portion 216 of the active region 202 is designed to be larger than the width W2 of the gate strip 206 substantially along the direction 300 and less than or equal to a device width W3 of the MOSFET 240 substantially along the direction 300 (the device width W3 is also defined as a maximum distance between the source and drain doped regions substantially along the channel width direction). In some embodiments as shown in FIG. 1A, the width W1 of the connecting portion 216 of the active region 202 is designed to be larger than the width W2 of the gate strip 206 substantially along the direction 300 and equal to the device width W3 of the MOSFET 240 substantially along the direction 300. Is it noted that the opposite sides 220 and 222 of the gate strip 206 are respectively aligned to opposite edges of the connecting portion 216, which are substantially parallel to the direction 302 as shown in FIG. 1A.

Figure 2:
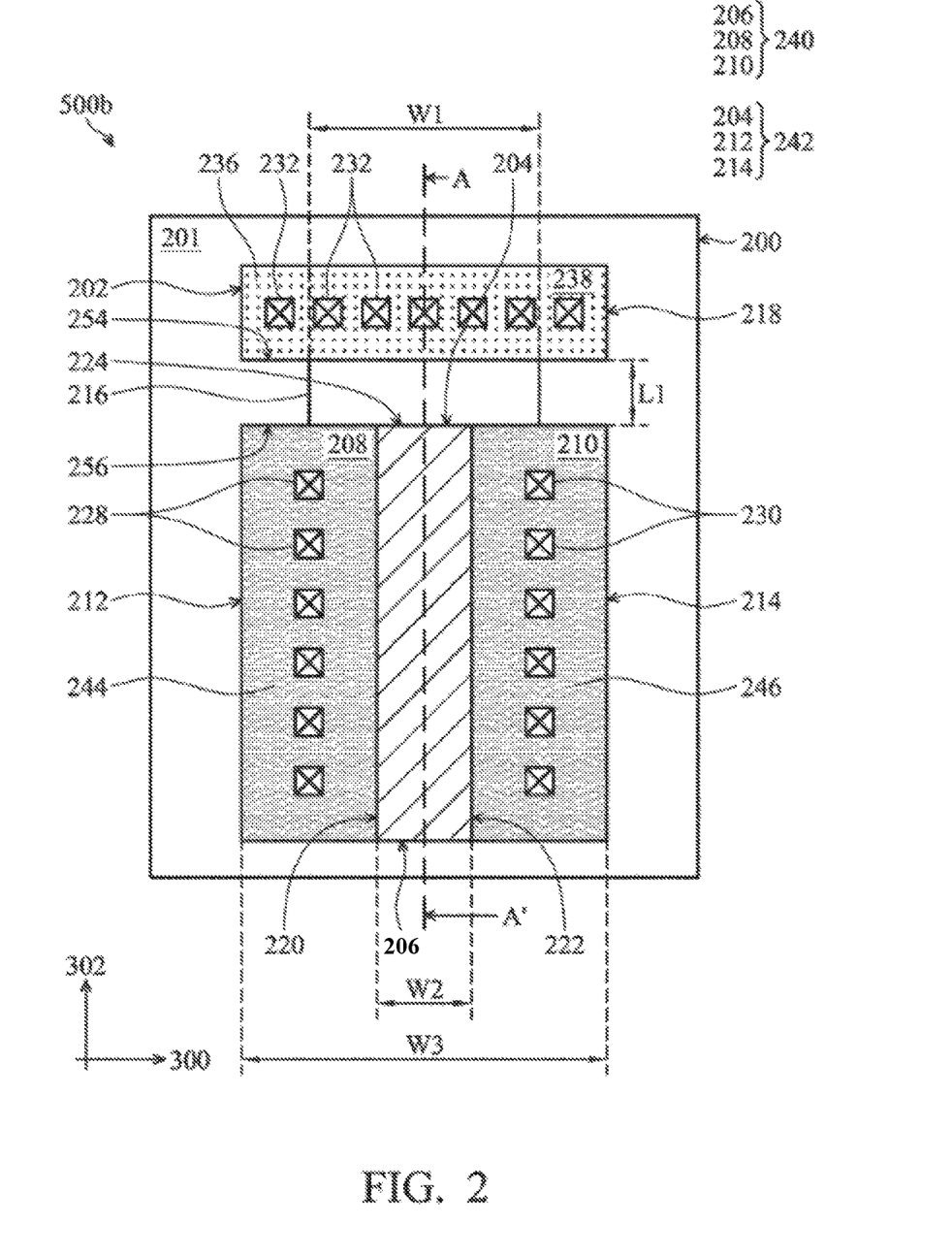
FIG. 2 shows a top view of another exemplary embodiment of a body-contact MOSFET device of the invention.

FIG. 2 shows a top view of another exemplary embodiment of a body-contact MOSFET device 500b of the invention. In some embodiments, FIG. 1B also serves as a cross section taken along line A-A' of FIG. 2, showing a cross section of another exemplary embodiment of a body-contact MOSFET device 500b of the invention. Elements of the embodiments hereinafter, that are the same or similar as those previously described with reference to FIGS. 1A and 1B, are not omitted for brevity. In some embodiments, the connecting portion 216 of the active region 202 of the body-contact MOSFET device 500b is designed with a width W1 substantially along the direction 300 and a length L1 substantially along the direction 302 as shown in as shown in FIG. 2. It is noted that the body-contact doped portion 218 is designed to be separated from the MOSFET portion 240 along the channel length direction, which is substantially parallel to the direction 302 as shown in FIG. 2 in accordance with some embodiments.

As shown in FIG. 2, the body-contact doped portion 218 of the body-contact MOSFET device 500b is separated from the gate strip 206, the source doped region 208 and the drain doped region 210 of the MOSFET 240 by the connecting portion 216 of the active region 202 and isolation the feature 201 in accordance with some embodiments. That is to say, the body-contact doped portion 218 of the active region 202 is separated from the first portion 206, second portion 212 and third portion 214 of the active region 202 by a distance. In some embodiments, the distance is equal to the length L1 of the connecting portion 216 of the active region 202 substantially along the direction 302 as shown in FIG. 2.

In some embodiments, the connecting portion 216 of the body-contact MOSFET device 500b is configured to provide a connection between the MOSFET portion 242 and the body-contact doped portion 218 of the active region 202 as shown in FIG. 2. In some embodiments, the connecting portion 216 of the active region 202 is designed not to be covered by any silicide features to avoid the short-circuit occurring between the body-contact doped portion 218 and the MOSFET 240 as shown in FIG. 2. Also, the connecting portion 216 of the active region 202 is designed not to be covered by the gate strip 206 or other polysilicon patterns to avoid generating any parasitic capacitance. In some embodiments, the parasitic capacitance includes, for example, a gate-to-substrate capacitance (Cgb), a gate-to-source capacitance (Cgs) or a gate-to-drain capacitance (Cgd). Therefore, the body-contact doped portion 218 and the gate strip 206 are adjacent to opposite sides 254 and 256 of the connecting portion 216 of the active region 202, respectively. As shown in FIG. 2, the opposite sides 254 and 256 of the connecting portion 216 of the active region 202 are substantially extended along the direction 300 in accordance with some embodiments.

In some embodiments, the width the width W1 of the connecting portion 216 of the active region 202 of the body-contact MOSFET device 500b is designed to be larger than the width W2 of the gate strip 206 substantially along the direction 300 and less than the device width W of the MOSFET 240 substantially along the direction 300 as shown in FIG. 2. Is it noted that the opposite sides 220 and 222 of the gate strip 206 of the body-contact MOSFET device 500b are respectively between opposite edges of the connecting portion 216, which are substantially parallel to the direction 302 as shown in FIG. 2. The width W1 of the connecting portion 216 of the active region 202 of the body-contact MOSFET device 500b is narrower than the device width W3 of the MOSFET 240 substantially along the direction 300 as shown in FIG. 2. Therefore, the active region 202 of the body-contact MOSFET device 500b is I-shaped in a top view as shown in FIG. 2. Therefore, a junction capacitance constructed by the source doped region 208 and/or the drain doped region 210 of the MOSFET 240 and the body-contact doped region 238 of the body-contact MOSFET device 500b can be reduced in accordance with some embodiments.

Figure 3:
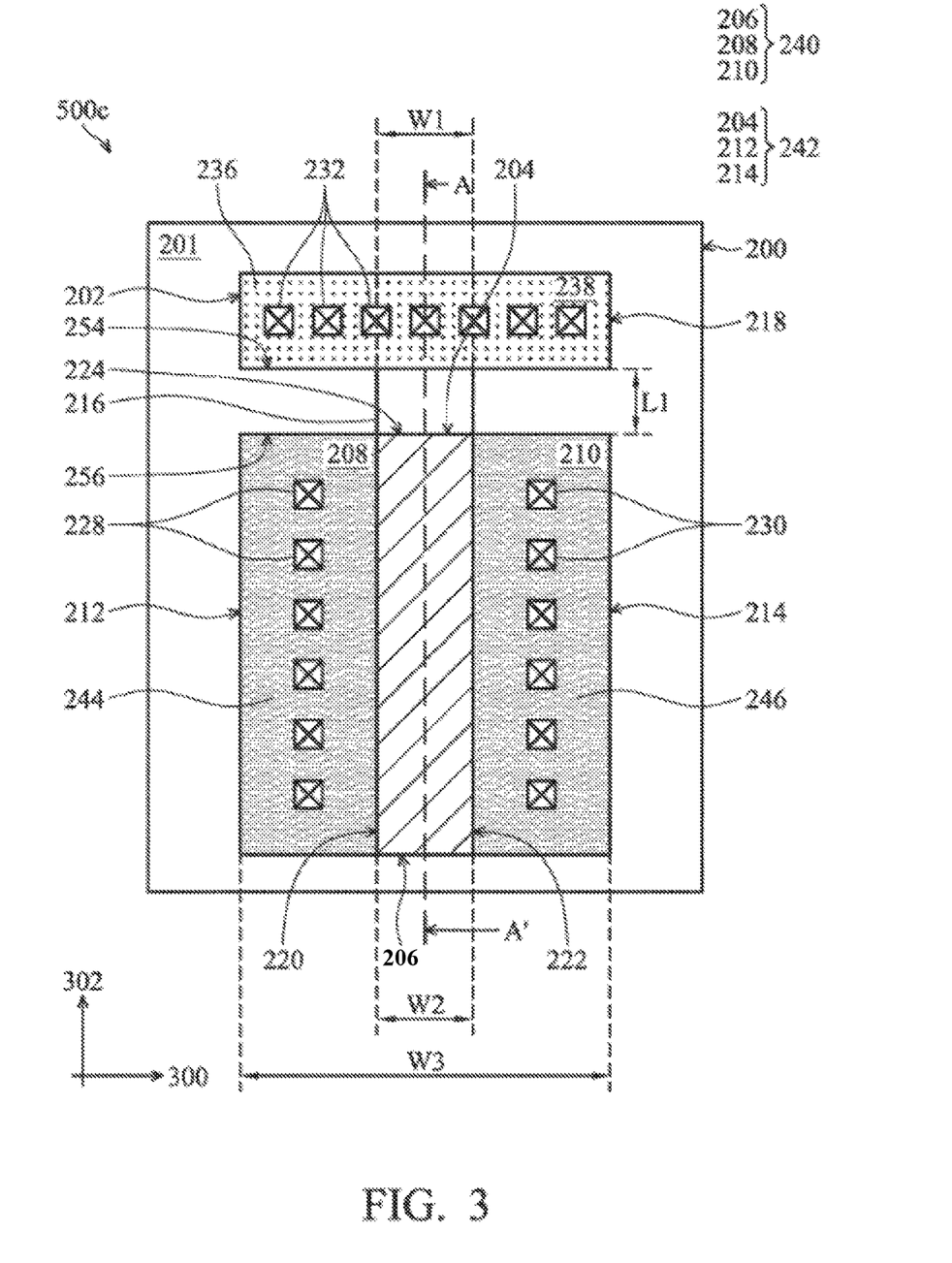
FIG. 3 shows a top view of yet another exemplary embodiment of a body-contact MOSFET device of the invention.

FIG. 3 shows a top view of yet another exemplary embodiment of a body-contact MOSFET device 500c of the invention. In some embodiments, FIG. 1B also serves as a cross section taken along line A-A' of FIG. 3, showing a cross section of yet another exemplary embodiment of a body-contact MOSFET device 500c of the invention. Elements of the embodiments hereinafter, that are the same or similar as those previously described with reference to FIGS. 1A and 1B and 2, are not omitted for brevity. In some embodiments, the connecting portion 216 of the active region 202 of the body-contact MOSFET device 500c is designed with a width W1 substantially along the direction 300 and a length L1 substantially along the direction 302 as shown in FIG. 3. It is noted that the body-contact doped portion 218 is designed to be separated from the MOSFET portion 240 along the channel length direction, which is substantially parallel to the direction 302 as shown in FIG. 3 in accordance with some embodiments.

As shown in FIG. 3, the body-contact doped portion 218 of the body-contact MOSFET device 500c is separated from the gate strip 206, the source doped region 208 and the drain doped region 210 of the MOSFET 240 by the connecting portion 216 of the active region 202 and the isolation feature 201 in accordance with some embodiments. That is to say, the body-contact doped portion 218 of the active region 202 is separated from the first portion 206, second portion 212 and third portion 214 of the active region 202 by a distance. In some embodiments, the distance is equal to the length L1 of the connecting portion 216 of the active region 202 substantially along the direction 302 as shown in FIG. 3.

In some embodiments, the connecting portion 216 of the body-contact MOSFET device 500c is configured to provide a connection between the MOSFET portion 242 and the body-contact doped portion 218 of the active region 202 as shown in FIG. 3. In some embodiments, the connecting portion 216 of the active region 202 of the body-contact MOSFET device 500c is designed not to be covered by any silicide features to avoid the short-circuit occurring between the body-contact doped portion 218 and the MOSFET 240 as shown in FIG. 3. Also, the connecting portion 216 of the active region 202 of the body-contact MOSFET device 500c is designed not to be covered by the gate strip 206 or other polysilicon patterns to avoid generating any parasitic capacitance. In some embodiments, the parasitic capacitance includes, for example, a gate-to-substrate capacitance (Cgb), a gate-to-source capacitance (Cgs) or a gate-to-drain capacitance (Cgd). Therefore, the body-contact doped portion 218 and the gate strip 206 are adjacent to opposite sides 254 and 256 of the connecting portion 216 of the active region 202, respectively. As shown in FIG. 3, the opposite sides 254 and 256 of the connecting portion 216 of the active region 202 are substantially extended along the direction 300 in accordance with some embodiments.

In some embodiments, the width the width W1 of the connecting portion 216 of the active region 202 of the body-contact MOSFET device 500c is designed to be equal to the width W2 of the gate strip 206 substantially along the direction 300 and less than the device width W3 of the MOSFET 240 substantially along the direction 300 as shown in FIG. 3. Is it noted that the opposite sides 220 and 222 of the gate strip 206 of the body-contact MOSFET device 500c are respectively aligned to opposite edges of the connecting portion 216, which are substantially parallel to the direction 302 as shown in FIG. 3. Therefore, the active region 202 of the body-contact MOSFET device 500c is I-shaped in a top view as shown in FIG. 3. The width W1 of the connecting portion 216 of the active region 202 of the body-contact MOSFET device 500c is narrower than the device width W3 of the MOSFET 240 substantially along the direction 300. Therefore, a junction capacitance constructed by the source doped region 208 and/or the drain doped region 210 of the MOSFET 240 and the body-contact doped region 238 of the body-contact MOSFET device 500c can be reduced in accordance with some embodiments.

In some other embodiments, the width the width W1 of the connecting portion 216 of the active region 202 of the body-contact MOSFET device is designed to be less than the width W2 of the gate strip 206 substantially along the direction 300 to further reduce the junction capacitance.

Embodiments of a body-contact metal-oxide-semiconductor field effect transistor (MOSFET) device are provided. The active region of the body-contact MOSFET device includes a connecting portion between and connected to both the MOSFET portion and the body-contact doped region portion. In some embodiments, the connecting portion is designed without being covered by any silicide features, gate strip and/or polysilicon pattern to avoid generating any parasitic capacitance (such as Cgb, Cgs or Cgd). Also, the connecting portion of active region of the body-contact MOSFET device is designed to have a reduced area in a top view to reduce the junction capacitance (constructed by the source doped region and/or the drain doped region of the MOSFET and the body-contact doped region). In some embodiments, the width of the connecting portion of the active region of the body-contact MOSFET device is designed to be equal to or larger than the width of the gate strip substantially along the channel width direction. Also, the width of the connecting portion of the active region of the body-contact MOSFET device is designed to be less than or equal to the maximum distance between the source and drain doped regions 208 and 210 substantially along the channel width direction. The body-contact MOSFET device has a reduced parasitic capacitance and junction capacitance, thereby improving an index of ON-state-resistance*OFF-state-capacitance (Ron* Coff). A body-contact MOSFET device having low RF loss and high linearity is obtained.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A body-contact metal-oxide-semiconductor field effect transistor (MOSFET) device, comprising:
   a substrate;
   an active region on the substrate;
   a gate strip extended substantially along a first direction disposed on a first portion of the active region;
   a source doped region and a drain doped region disposed on a second portion and a third portion of the active region, adjacent to opposite sides of the gate strip,
   wherein the opposite sides of the gate strip are extended substantially along the first direction; and
   a body-contact doped region disposed on a fourth portion of the active region, wherein the body-contact doped region is separated from each of the gate strip, the source doped region, and the drain doped region by a same distance in the first direction via a fifth portion of the active region, wherein the fifth portion is not covered by any silicide features,
   wherein a top surface of the fifth portion is entirely covered by and only in contact with a dielectric layer.

2. The body-contact MOSFET device as claimed in claim 1, wherein the body-contact doped region is separated from the gate strip along the first direction.

3. The body-contact MOSFET device as claimed in claim 1, wherein the source doped region and the drain doped region have a first conductive type, and the body-contact doped region has a second conductive type opposite to the first conductive type.

4. The body-contact MOSFET device as claimed in claim 1, wherein the body-contact doped region and the gate strip are adjacent to opposite sides of the fifth portion of the active region, respectively.

5. The body-contact MOSFET device as claimed in claim 4, wherein the first portion and the fourth portion of the active region are adjacent to the opposite sides of the fifth portion of the active region, respectively.

6. The body-contact MOSFET device as claimed in claim 4, wherein the opposite sides of the fifth portion of the active region are extended substantially along a second direction different from the first direction.

7. The body-contact MOSFET device as claimed in claim 6, wherein a width of the fifth portion of the active region substantially along the second direction is larger than a width of the gate strip substantially along the second direction and less than or equal to a maximum distance between the source and drain doped regions substantially along the second direction.

8. The body-contact MOSFET device as claimed in claim 6, wherein a width of the fifth portion of the active region substantially along the second direction is equal to or less than a width of the gate strip substantially along the second direction.

9. The body-contact MOSFET device as claimed in claim 1, wherein the fifth portion of the active region is not covered by the gate strip.

10. The body-contact MOSFET device as claimed in claim 1, wherein the fourth portion of the active region is separated from the first, second and third portions of the active region by a distance.

11. The body-contact MOSFET device as claimed in claim 10, wherein the distance is equal to a length of the fifth portion of the active region along the first direction.

12. The body-contact MOSFET device as claimed in claim 1, wherein the substrate comprises a silicon-on-insulator (SOI) substrate or silicon-on-sapphire (SOS) substrate.

13. A body-contact metal-oxide-semiconductor field effect transistor (MOSFET) device, comprising:
   a substrate; and
   an active region on the substrate, comprising:
   a metal-oxide-semiconductor field effect transistor (MOSFET) portion configured for a MOSFET formed thereon;
   a body-contact doped region portion configured for a body-contact doped region formed thereon, wherein the MOSFET portion is separated from the body-contact doped region portion; and
   a connecting portion between and connected to both the MOSFET portion and the body-contact doped region portion, wherein the connecting portion is not covered by any silicide features,
   wherein a top surface of the connecting portion is entirely covered by and only in contact with a dielectric layer;
   wherein the MOSFET comprises:
   a gate strip covering the MOSFET portion; and
   a source doped region and a drain doped region on the MOSFET portion and adjacent to and aligned with opposite sides of the gate strip, wherein the body-contact doped region is separated from each of the gate strip, the source doped region, and the drain doped region by a same distance.

14. The body-contact MOSFET device as claimed in claim 13, wherein the MOSFET has a channel width direction and a channel length direction substantially vertical to the channel width direction.

15. The body-contact MOSFET device as claimed in claim 14, wherein the MOSFET portion is separated from the body-contact doped region portion substantially along the channel length direction.

16. The body-contact MOSFET device as claimed in claim 14, wherein: the source doped region and the drain doped region are separated from each other substantially along the channel width direction.

17. The body-contact MOSFET device as claimed in claim 16, wherein the source doped region and the drain doped region have a first conductive type, and the body-contact doped region has a second conductive type opposite to the first conductive type.

18. The body-contact MOSFET device as claimed in claim 16, wherein the body-contact doped region and the gate strip are adjacent to opposite sides of the connecting portion of the active region.

19. The body-contact MOSFET device as claimed in claim 16, wherein a width of the connecting portion substantially along the channel width direction is narrower than or equal to a width of the gate strip substantially along the channel width direction.

20. The body-contact MOSFET device as claimed in claim 16, wherein a width of the connecting portion along the channel width direction is larger than a width of the gate strip substantially along the channel width direction and less than a maximum distance between the source and drain doped regions substantially along the channel width direction.

21. The body-contact MOSFET device as claimed in claim 16, wherein the connecting portion of the active region is not covered by the gate strip.

22. The body-contact MOSFET device as claimed in claim 13, wherein the substrate comprises a silicon-on-insulator (SOI) substrate or silicon-on-sapphire (SOS) substrate.

23. The body-contact MOSFET device as claimed in claim 13, wherein the body-contact doped region portion and the MOSFET portion are covered by silicide features.

24. A body-contact metal-oxide-semiconductor field effect transistor (MOSFET) device, comprising:
   a substrate; and
   an active region on the substrate, comprising:
   a metal-oxide-semiconductor field effect transistor (MOSFET) portion configured for a MOSFET formed thereon; and
   a body-contact doped region portion configured for a body-contact doped region formed thereon, wherein the MOSFET portion is connected to the body-contact doped region portion only through a connecting portion, wherein the connecting portion is not covered by any silicide features,
   wherein a top surface of the connecting portion is entirely covered by and only in contact with a dielectric layer;
   wherein the MOSFET comprises:
   a gate strip covering the MOSFET portion; and
   a source doped region and a drain doped region on the MOSFET portion and adjacent to and aligned with opposite sides of the gate strip, wherein the body-contact doped region is separated from each of the gate strip, the source doped region, and the drain doped region by a same distance.

25. The body-contact MOSFET device as claimed in claim 24, wherein the MOSFET has a channel width direction and a channel length direction vertical to the channel width direction.

26. The body-contact MOSFET device as claimed in claim 25, wherein the MOSFET portion is separated from the body-contact doped region portion along the channel length direction.

27. The body-contact MOSFET device as claimed in claim 25, wherein the source doped region and the drain doped region are separated from each other substantially along the channel width direction.

28. The body-contact MOSFET device as claimed in claim 27, wherein the source doped region and the drain doped region have a first conductive type, and the body-contact doped region has a second conductive type opposite to the first conductive type.

29. The body-contact MOSFET device as claimed in claim 27, wherein a width of the connecting portion substantially along the channel width direction is narrower than or equal to a width of the gate strip substantially along the channel width direction.

30. The body-contact MOSFET device as claimed in claim 27, wherein a width of the connecting portion substantially along the channel width direction is larger than a width of the gate strip substantially along the channel width direction and less than or equal to a maximum distance between the source and drain doped regions substantially along the channel width direction.

31. The body-contact MOSFET device as claimed in claim 27, wherein the connecting portion of the active region is not covered by the gate strip.

32. The body-contact MOSFET device as claimed in claim 24, wherein the substrate comprises a silicon-on-insulator (SOI) substrate or silicon-on-sapphire (SOS) substrate.

* * * * *